United States Patent [19]

Roth

[11] Patent Number: 4,511,076
[45] Date of Patent: Apr. 16, 1985

[54] METHOD OF SOLDERING CIRCUIT BOARDS WITH SOLDER-REPELLENT CONTACTS

[75] Inventor: Johann Roth, Schwabhausen, Fed. Rep. of Germany

[73] Assignee: Braun Aktiengesellschaft, Kronberg, Fed. Rep. of Germany

[21] Appl. No.: 613,749

[22] PCT Filed: Apr. 8, 1982

[86] PCT No.: PCT/DE82/00082
§ 371 Date: Dec. 6, 1982
§ 102(e) Date: Dec. 6, 1982

[87] PCT Pub. No.: WO82/03723
PCT Pub. Date: Oct. 28, 1982

Related U.S. Application Data

[63] Continuation of Ser. No. 448,916, Dec. 6, 1982, abandoned.

[30] Foreign Application Priority Data

Apr. 10, 1981 [DE] Fed. Rep. of Germany ....... 3114607

[51] Int. Cl.³ ............................................... H05K 3/34
[52] U.S. Cl. .................................. 228/180.1; 228/215
[58] Field of Search ................. 228/118, 215, 180 R; 339/278 D

[56] References Cited
U.S. PATENT DOCUMENTS 3,249,910  5/1966  Venn et al. ........................ 228/118
3,610,811 10/1971  O'Keefe ............................ 174/68.5
3,620,839 11/1971  Geckie .............................. 200/285
3,673,539  6/1972  Healy et al. ....................... 338/154
4,038,504  7/1977  McAnulty et al. ................. 200/292
4,045,636  8/1977  Yoder et al. ...................... 200/267
4,057,520 11/1977  Schwartz .......................... 200/292
4,180,711 12/1979  Hirata et al. ..................... 200/267
4,243,852  1/1981  Larson ............................. 200/267
4,287,394  9/1981  Hargita et al. ................... 200/267

FOREIGN PATENT DOCUMENTS 1485236 11/1939  Fed. Rep. of Germany .
2537249  8/1975  Fed. Rep. of Germany .
2921753  5/1979  Fed. Rep. of Germany .
2757984  6/1979  Fed. Rep. of Germany ...... 200/285
2940583 10/1979  Fed. Rep. of Germany .
 817741  2/1937  France .
1483948  4/1966  France .
2124457  2/1972  France .
2241856  8/1974  France .
2308174  4/1976  France .
2430165  6/1979  France .

Primary Examiner—Kenneth J. Ramsey
Attorney, Agent, or Firm—Raymond J. De Vellis

[57] ABSTRACT

In a contact device having at least first and second contact surfaces which may be placed in electrically conducting contact with one another, that improvement which includes a solder-repellent and self-lubricating casing material applied to at least one of said contact surfaces. The solder-repellent contact surface also serves as a stop-off when soldering component leads to terminals of a printed circuit board.

4 Claims, 5 Drawing Figures

METHOD OF SOLDERING CIRCUIT BOARDS WITH SOLDER-REPELLENT CONTACTS

This application is a continuation of application Ser. No. 448,916, fled Dec. 6, 1982, now abandoned.

BACKGROUND OF THE INVENTION

1. Field of the Invention

The invention relates to contact devices in electrical units, especially contact devices which are provided on the circuit boards of small electrical appliances, for example watches, cameras and electric shavers.

2. Description of the Prior Art

Such small appliances are generally equipped with their own power source. It is known to use circuit boards in such appliances to control the proper supply of current. The circuit boards can consist, for example, of hard paper and preferably have copper strips as conductors, which are expanded at various points into so-called soldering lugs. The soldering lugs are used to receive the feed lines from electronic components, for example capacitors or transistors, or the feed lines of contact devices which interact with the circuit board.

By soldering the feed lines from the electronic components with the conductor strips of the circuit board, the components are connected electrically with the conductor strips and mechanically with the circuit board. This is generally done using machine-type soldering methods, for example the flow-solder method or the drag-solder method. Besides conductor strips, resistor strips of various resistances may also be printed on such circuit boards. Such printed-on resistors, whose resistance depends on the material utilized and on the dimensions of the resistor strip, can be applied, for example, with so-called resistor pastes in a screen printing method.

The circuit board can also have contact surfaces which are part of an electrical contact device and which are contacted by a movable element, for example a spring plate or a contact slide. Such contact surfaces are generally gilded, to prevent an impairment of the conductivity of the contact surface by corrosion, and thus guarantee a reliable contact over the longest possible time. However, silver, nickel, or tinned contact surfaces have also been used for this purpose. Such circuit boards are quite expensive to fabricate, because the various layers must be applied in several electroplating baths, while covering the remaining circuit board surface. Apart from this, the expense of the nobel metal layers is quite considerable.

With such circuit boards, it is also necessary that the contact surfaces, which interact with other parts of the contact device, be completely covered by suitable means during the machine-type soldering process of the circuit board, so as to prevent contamination of the contact surfaces by solder which may adhere from the soldering bath. All these process steps make fabrication of a circuit board very expensive if this circuit board has both soldering lugs for receiving electronic components as well as contact surfaces associated with a contact device.

Another disadvantage of the known contact devices, which have contact surfaces affixed to circuit boards, consists in the fact that, again to avoid corrosion, the remaining contact surfaces of the contact device, which are not affixed on conductor strips, must be provided with conducting and corrosion-resistant casings. Application of these casings can also take place in electroplating baths, where the above-mentioned metals are again used.

In principle, all contact surfaces must therefore be provided with corrosion-resistant casings, regardless whether or not they contain contact surfaces that are affixed on circuit boards. This is true, for example, for spring-plate contact devices, which do not have contact surfaces affixed on conductor strips, but whose terminals are soldered to the circuit board, so as to establish an electrical or mechanical connection with the latter. It is also true for contact devices which are not connected with a circuit board either electrically or mechanically.

Another common disadvantage of all known contact devices, whose contact surfaces touch one another and thereby slide against one another, is the necessity of subsequently greasing the metal-coated contact surfaces. Otherwise, due to corrosion, operational disturbances could occur, which would make necessary the complete replacement of the contact device.

SUMMARY OF THE INVENTION

One object of the invention is to provide a contact device which does not have the above deficiencies, especially not the necessity of covering the circuit board during electroplating and during the machine-type soldering process, when fabricating the contact surfaces that are affixed on the circuit boards.

In general, the invention features a contact device, the contact surfaces of which are provided with a conducting, corrosion-resistant, solder-repelling, and self-lubricating casing.

These and other features of the invention will be explained by way of a number of preferred embodiments, reference being had to the accompanying drawings, wherein:

DESCRIPTION OF THE PREFERRED EMBODIMENTS

Figure 1:
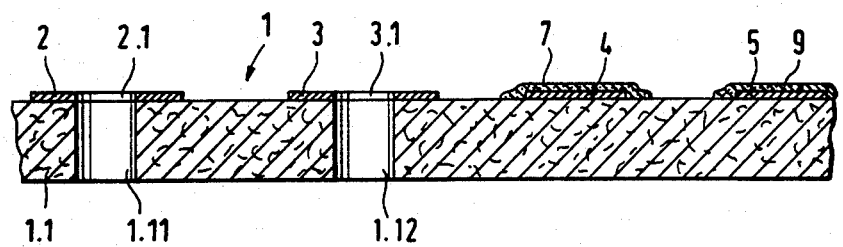
FIG. 1 is a cross-sectional view of a circuit board, which has soldering lugs and conductor strip sections that are encased with graphite lacquer.

FIG. 1 shows a circuit board 1 of an electrical device, whose board body 1.1 is equipped, in well-known fashion, with several conductors 2, 3, 4, and 5, which consist of copper strips. As is well-known, their purpose is to conduct to the various components relatively weak currents, particularly control currents.

Figure 2:
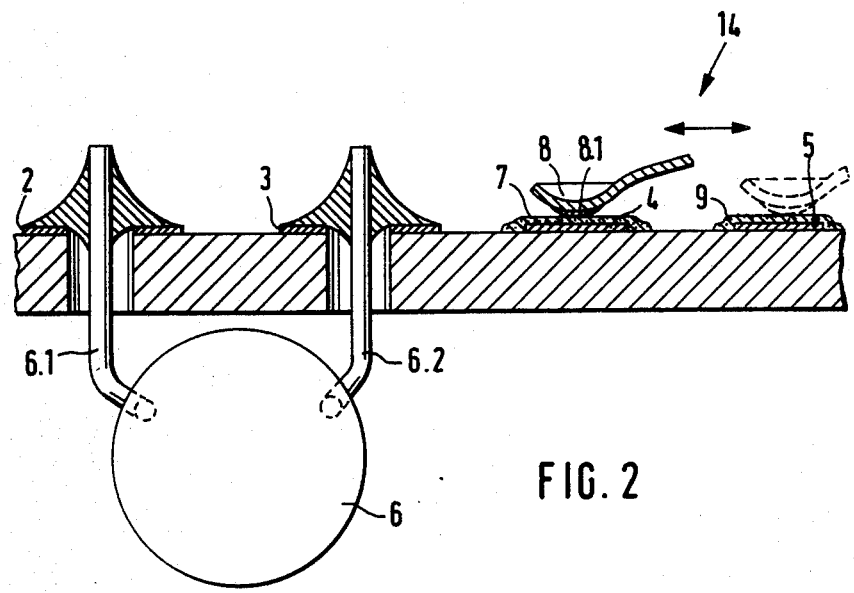
FIG. 2 is a cross-sectional view of the circuit board of FIG. 1 after machine-type soldering. Its conductor strips, together with a contact slide, form a first contact device according to the invention.

Here, the copper strips 2 and 3, which are shown in cross-section, are designed as soldering lugs and are therefore respectively provided with a centric opening 2.1 and 3.1. Each of these openings is aligned with a hole 1.11 and 1.12 of the plate body 1.1, which consists, for example, of hard paper. These soldering lugs are used for the solid connection of an electronic component, for example a diode 6 as shown in FIG. 2 with the copper strips 2 and 3. For this purpose, the two feed lines 6.1 and 6.2 of the diode 6 are pushed through the holes 1.11 and 1.12 of the plate body 1.1, so that their ends dip into the soldering lugs 2.1 and 3.1 of the copper strips 2 and 3. Then they are electrically and mechanically connected with the copper conductors by means of soldering.

FIG. 2 shows the feed lines 6.1 and 6.2 of the diode 6, soldered to the copper strips 2 and 3 of the circuit board. The soldering is here generally done by machine, for example using the drag solder method, in which the entire upper side of the circuit board is brought into contact with liquid solder, whereby all the solder junctions are fabricated in one working step.

It is well known in the art of machine soldering (for example, using the drag soldering method mentioned above) that savings in the cost of materials can be realized by coating the upper surface of the printed circuit board with an electrically insulating and solder-repellant substance (e.g., a varnish). The electrically insulating and solder-repellant substance is applied to those portions of the upper surface where it is desired that solder not adhere. The electrically insulating and solder-repellant substance may be applied in an appropriate pattern, for example, by a screening process, leaving the soldering lugs 2.1 and 3.1 uncoated to be exposed to solder during the soldering step.

On the other hand, the substrate 1.1 is usually fairly solder-resistant of its own account. Therefore, when there are few conductor strips on the upper surface of the printed circuit board, the loss of solder through deposition on exposed conductor strips may be more than compensated by the savings in eliminating the step of applying the electrically insulating and solder-resistant coating. However, where the conductor strips are numerous, it is well known that applying such a coating can lead to a savings in the relatively expensive soldering material.

The copper strips 4 and 5 of the circuit board 1, which is shown in FIGS. 1 and 2, are by contrast not used for soldering to electronic components. Rather, they are provided as the contact surfaces of an electrical contact device according to the invention. Consequently, they may not have solder adhere to them during the machine-type soldering process.

According to the present invention, therefore, copper strips 4 and 5 are provided with casings 7 and 9, respectively, consisting of graphite lacquer, for example with the graphite lacquer marketed by Acheson Colloids B.V. Company, Postbus 1, 9679 ZG Scheemda, Holland, under the registered trademark "423SS". At a temperature of about 80° C., this has a drying time of about 30 minutes.

Complete protection of the copper strips 4 and 5 against adhering solder is reliably achieved if the casings 7 and 9 also completely surround the side walls of the copper strips 4 and 5. The casing of the copper strips can be produced relatively easily by a screen printing method that is itself well-known or also by a lacquer spraying method using a template.

FIG. 2 schematically shows a contact slide 8 of a contact device 14, whose contact surface is likewise provided with a casing 8.1 of graphite lacquer. This casing is easier to fabricate, than that of the conductor strips, since, in addition to the already mentioned methods, for example, the dip-lacquer method can also be used.

The contact slide 8 can be moved in the direction designated in FIG. 2 by a double arrow. It can thus reach a first terminal position, where it makes electric contact with the conductor strip 4, and a second terminal position, in which it makes electrical contact with conductor strip 5. In this fashion, individual components or groups of components can be activated or decoupled in an driving or control circuit of the electrical device.

The graphite layers 7 and 9 have self-lubricating properties. This obviates the greasing of the slide strip, which must be periodically repeated, and which is required when using metal-coated contact surfaces.

Figure 3:
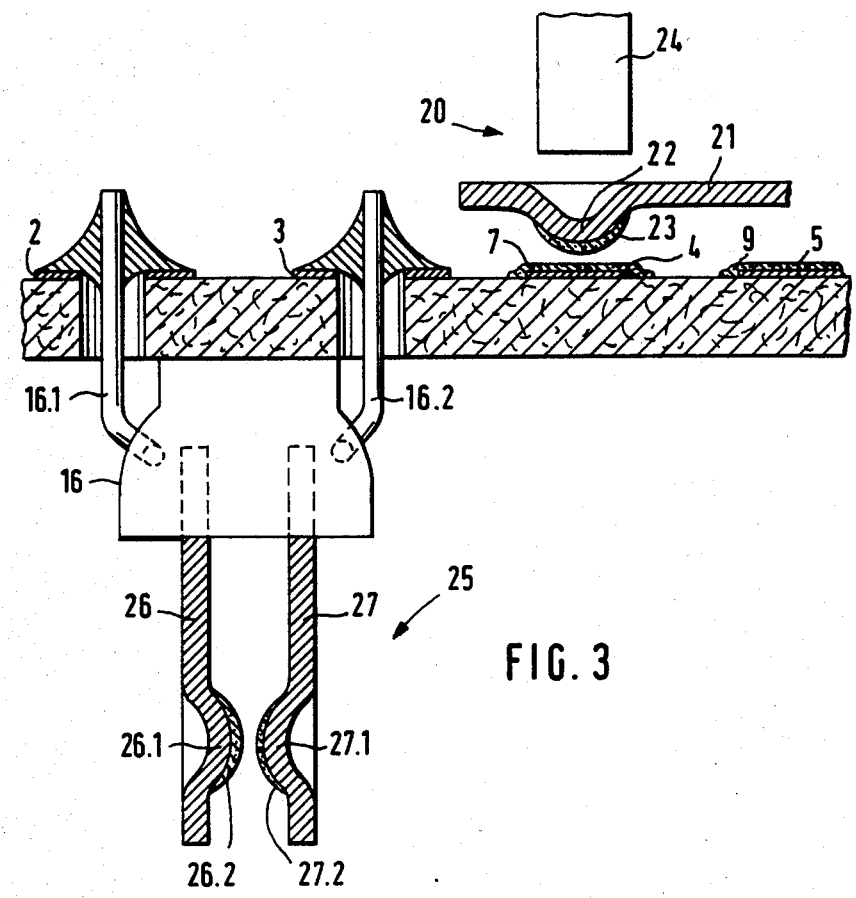
FIG. 3 is a cross-sectional view of the circuit board of FIG. 2, where one of its conductor strips, together with a spring plate contact, forms a second contact device according to the invention wherein a third contact device according to the invention consisting of two spring plates, is mechanically rigidly connected with the circuit board.

The embodiments (20, 25) of the inventive contact device, which are shown in FIG. 3, involve contact devices whose contacts are not closed in the shown idle position and which are closed only by activating a lever or the like. Such examples of contact devices which interact with circuit boards of small electric appliances are found, among other places, in battery-driven watches with electro-optic displays, where, for reasons of saving current, the time is indicated only upon activation of a key of the like.

The contact device (20) is shown at the top right in FIG. 3. It essentially consists of a spring plate 21 which has a curved contact surface 22, that is provided with a casing 23 consisting of graphite lacquer; the conductor strip section 4; its casing 7; and a schematically shown activation lever 24. The spring plate 21 can, for example, be mechanically connected with the housing of the electrical small appliance and can be connected electrically with its power supply. When the activation lever 24 is depressed, the conductor strip 4, which is equipped with a casing 7, is connected with the power supply. This activation lever 24 can be placed in a recess (not shown) of the housing and can be provided with a push button.

The contact device 26 is shown on the lower left in FIG. 3. It has two spring plates 26 and 27, whose contact surfaces 26.1 and 27.1 are coated with casings (26.2, 27.2) of graphite lacquer. Both spring plates are mechanically connected with a mount 16 which, for example, can consist of plastic into which the spring plates are cast. The mount 16 has two rigid feed lines 16.1 and 16.2 which are electrically connected with the spring plates 26 and 27 respectively and which are soldered into the soldering lugs 2 and 3 respectively of the circuit board. To further stabilize the mechanical connection between the circuit board and the two spring plates 26 and 27, the mount 16 can have a protrusion (not shown), which interacts with a corresponding recess in the circuit board. The two contact surfaces 26.1 and 27.1 can be brought into contact with one another by depressing an activation lever (not shown), and thus a switching process can be initiated.

The inventive contact device, which is shown in the lower left in FIG. 3, no longer has a contact surface that is integrated into the circuit board. It also need not be connected with the circuit board mechanically, but can be affixed at an arbitrary point of the electric appliance.

Figure 4:
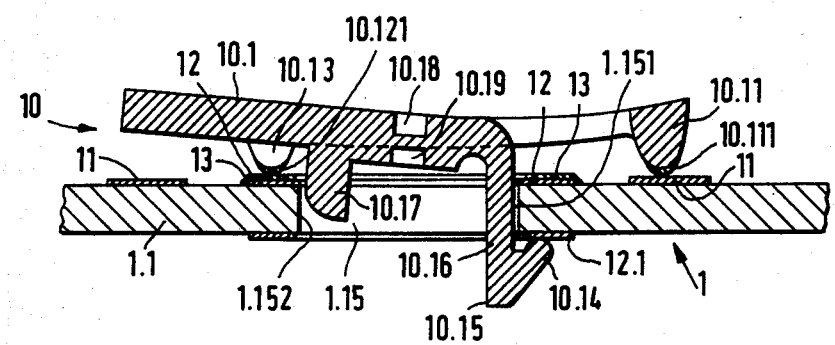
FIG. 4 is a cross-sectional view of a contact device according to the invention, which is designed as part of a potentiometer.
Figure 5:
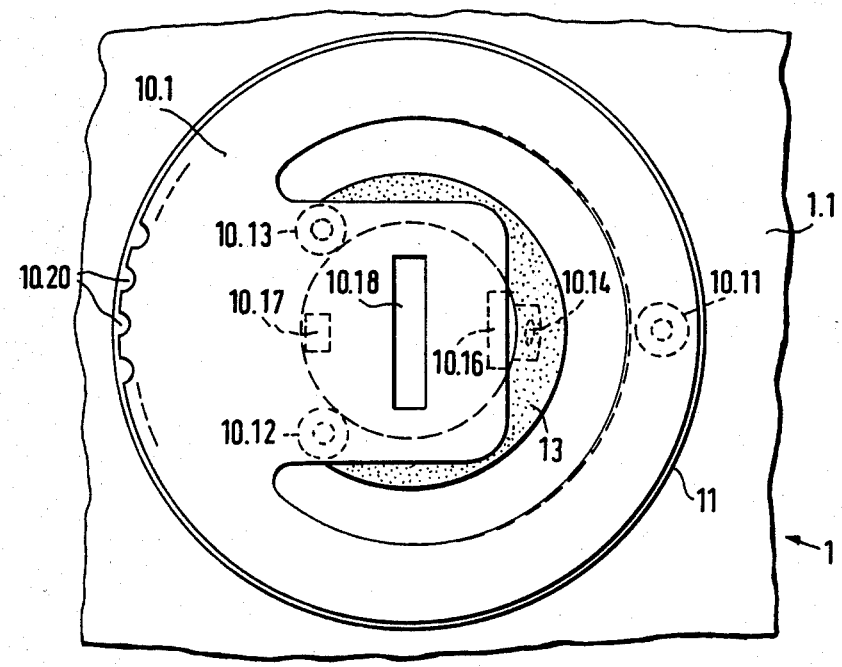
FIG. 5 is a plan view of the contact device of FIG. 4.

A fourth embodiment of the inventive contact device is shown in FIGS. 4 and 5. In this embodiment, contact surfaces of the contact device are again part of a circuit board, which interacts with other contact surfaces of the contact device in such a fashion that a potentiometer is created, which is partly integrated into the circuit board. In this embodiment, too, solder-repelling and self-lubricating properties of casings that consist of graphite lacquer are of essential significance.

As FIG. 4 shows, the part of the potentiometer 10, which is integrated into the circuit board 1, consists of a so-called resistor strip 11, a conductor strip 12, and a circular layer 12.1 of graphite lacquer. The conductor strip 12 and the layer 12.1 can form a closed circular ring, while the resistor strip 11 consists of a circular of a circular ring section. The rotatable part of the potentiometer 10, here consists of a contact slide 10.1.

The conductor strip 12 is provided with a casing 13 of graphite lacquer and is therefore solder-repelling, while the likewise solder-repelling resistor strip 11 consists, for example, of a resistor paste that is applied to the circuit board 1 by means of a screen printing process. The contact slide 10.1 here consists of a single body of electrically conducting material with great bending flexibility. A contact nub 10.11 is formed thereon, which is provided with a casing 10.111 of graphite lacquer. It slides on the resistor strip 11 in self-lubricating fashion. Two further contact nubs 10.12 and 10.13 are also formed on the contact slide 10.1. They ride on the casing 13 of the conductor strip 12 in self-lubricating fashion, and also have casings 10.121 and 10.131 respectively, consisting of graphite lacquer (in FIG. 4, only the casing 10.121 is visible).

A protrusion 10.14 is formed on a shoulder 10.15, which grips the circuit board body 1.1 from below. The shoulder 10.15 belongs to a segment 10.16 which extends approximately at a right angle to the plane of the circuit board, and which penetrates through a bearing hole 1.15 of the circuit board 1. Another segment 10.17 of the contact slide 10 extends approximately at a right angle to the plane of the slide and contacts (according to FIG. 3) the left wall section 1.152 of the bearing hole 1.15 of the circuit board 1. Both segments 10.16 and 10.17, in their interaction with the right and left wall sections 1.151 and 1.152 of the bearing hole 1.15, thus form an adequate bearing for the contact slide 10.1 within the bearing hole 1.15. The protrusion 10.14 slides on the graphite-lacquer layer 12.1 in self-lubricating fashion. It is dimensioned so that, in colaboration with the resetting forces of the spring action contact slide 10.1, it axially secures the latter and causes a triple-point contact of the contact nubs 10.11, 10.12, 10.13 on the conductor strip 12 and/or the resistor strip 11. The contact slide 10.1 is advantageously formed of an appropriately shaped leaf spring consisting of a highly conductive material, for example brass. However, according to another characteristic of the invention, it can also consist of electrically conducting thermoplastic with good spring properties and good abrasion strength.

To turn the contact slide 10.1 with respect to the circuit board 1, positioning slots 10.18 and 10.19 have been formed onto the slide body. A key or a tool (for example a screwdriver) can be inserted into these slots both from the upper side and from the lower side of the circuit board. Plug recesses 10.20 are provided at the circumference of the contact slide 10.1, and these serve the same purpose. If the potentiometer has limited accessibility, they make possible a step-by-step turning of the contact slide 10.1 by continuously resetting a suitable key from recess to recess.

In FIGS. 4 and 5, the three electrical connections that are customary for potentiometers are not shown. These are specifically: a connection at one end of the resistor strip 11; a connection at the other end of the resistor strip 11, between which the entire resistance of the resistor strip 11 is present; and a connection on the conductor strip 12 for tapping the resistance which depends on the position of the contact slide.

The embodiment of the contact device according to the invention is not limited to the above described embodiments, rather, the casing of the contact surfaces with economical and easily applied graphite lacquer, on the basis of its solder-repelling and self-lubricating properties, can be advantageously used in many other electrical contact devices according to the invention. Likewise, in place of the above-mentioned graphite lacquer from Acheson Company, any other graphite lacquer can be used, or another material can be used for encasing the contact surfaces, inasmuch as it is comparable with respect to electrical conductivity and corrosion resistance, and inasmuch as it has solder-repelling and self-lubricating properties.

While the invention has been described by way of particular preferred embodiments, various substitutions of equivalents may be effected without departing from the spirit or scope of the invention as set forth in the following claims.

What is claimed as new and desired to be secured by Letters Patents of the United States is:

1. A method for the manufacture of a printed circuit board having electrical components mounted thereupon by being mechanically soldered to lands adjacent through holes provided in said printed circuit board, said lands being electrically interconnected to conductive tracks, said printed circuit board also being provided on a designated surface thereof with at least a first electrically exposed and corrosion-resistant contact surface for controlling the operation of said printed circuit board, said method of manufacture comprising the steps of:
   (a) applying a solder-repellant but electrically conductive, corrosion-resistant and self-lubricating coating to said at least one contact surface;
   (b) inserting said electrical components into said lands, and
   (c) thereafter, exposing said designated surface and said solder-repellant coating to solder to mechanically and electrically connect said electrical components to said lands.

2. A method according to claim 1, further comprising the initial step of applying an electrically insulating and solder-repellant substance to all of said designated surface with the exception of said lands and said contact surfaces.

3. A method according to claim 1, wherein said solder-repellant but electrically conductive coating comprises a graphite lacquer.

4. A printed circuit board manufactured according to the method of claim 1.

* * * * *